Dec. 26, 1967 C. J. WEIDKNECHT 3,360,746

CRYSTAL CONTROLLED FREQUENCY MODULATED OSCILLATOR

Filed Nov. 19, 1963

INVENTOR.
CHARLES J. WEIDKNECHT

BY B. T. Wobensmith
ATTORNEY

United States Patent Office 3,360,746
Patented Dec. 26, 1967

3,360,746

CRYSTAL CONTROLLED FREQUENCY MODULATED OSCILLATOR

Charles J. Weidknecht, Willow Grove, Pa., assignor to Datacom, Inc., Warrington, Pa., a corporation of Pennsylvania Filed Nov. 19, 1963, Ser. No. 324,703
6 Claims. (Cl. 332—26)

This invention relates to crystal controlled oscillators and more particularly to crystal controlled oscillators which may be frequency modulated.

Crystal controlled oscillators are characterized by the use of a piezoelectric crystal rather than a tuned circuit as the frequency determining element. The outstanding property of crystal-controlled oscillators is an exceptional degree of frequency stability. The high degree of stability is a direct result of the high "Q" of the crystal unit employed.

Due to its high frequency stability, direct frequency modulation of a crystal controlled oscillator has not been used extensively except where relatively small frequency deviations were desired. In many crystal controlled oscillators, the crystal is employed as a means for stabilizing the oscillations within an electrical circuit or for maintaining the carrier or center frequency of an oscillator. For additional information regarding crystal controlled oscillators, reference may be made to Crystal Controlled Oscillator, United States Patent Number 2,906,969, issued to C. Rosen and C. J. Weidknecht (the instant inventor), and which issued on Sept. 29, 1959. This reference presents a lucid discussion of the use and operation of crystals in crystal controlled oscillators.

In present-day telemetering systems, as well as other systems employing phase or frequency modulation, circuits employing crystal controlled oscillators have been used extensively. Primarily, such circuits have been used because they provide greatly increased stability of the carrier frequency over many similar circuits utilizing reactance modulated variable frequency oscillators.

Furthermore, in telemetering systems especially those associated with guided missiles or other pilotless aircraft, it is important that the size and weight of the telemetering equipment be kept to a minimum. Additionally, if power dissipation is kept low cooling equipment requirements may be eliminated or at least substantially reduced. Therefore, the smaller and lighter the components of the systems, the more efficient the payload.

Briefly, the instant circuit provides a crystal controlled oscillator circuit which is frequency modulated. In addition, control elements are provided to contribute variability to tuned circuits which permit the frequency modulation to be a faithful replica of the input modulating signal. Various types of compensation networks assure proper operation of the circuit under ambient temperature conditions. In typical operation, the carrier frequency may be on the order of 30 megacycles per second and the modulation bandwidth may extend from about D.C. to about 150 kilocycles per second, or better. Moreover, the deviation is on the order of $\pm 16$ kilocycles per second, with total harmonic distortion of 0.5% or less. Of course, for telemetering applications, the frequencies are normally multiplied by 8 to obtain the standard range of operation.

It is an object of this invention to provide an improved crystal controlled oscillator.

Another object of the invention is to provide an improved crystal controlled oscillator in which the frequency of the oscillator may be controlled in accordance with the modulating signal.

Another object of this invention is to provide a crystal controlled oscillator circuit which utilizes semiconductor components as active elements thereof.

Another object of this invention is to provide a crystal controlled oscillator circuit which may be fabricated of small, light-weight components having little power dissipation.

Another object of this invention is to provide a crystal controlled oscillator circuit which may be used with frequency modulation generators of low distortion and medium bandwidth.

Another object of this invention is to provide an oscillator having a transistorized amplifier and a highly sensitive, yet stable, tuning network associated therewith.

Another object of this invention is to provide a crystal controlled oscillator circuit which may be used in telemetering applications.

Other objects and advantages of this invention will become more readily apparent when the following specification is read in conjunction with the accompanying drawings, in which.

It should, of course, be understood that the description and drawings herein are merely illustrative and that various modifications and changes can be made in the structure disclosed without departing from the spirit of the invention. In addition, like numerals refer to like parts throughout the several views.

Figure 1:
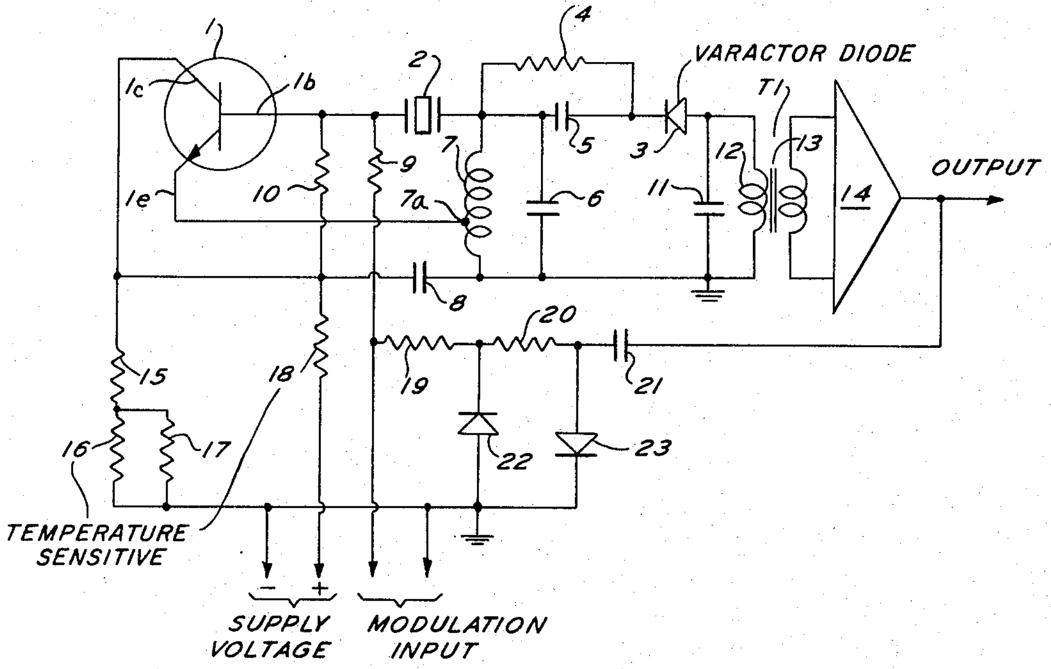
FIGURE 1 is a schematic diagram of a preferred embodiment of an improved crystal controlled oscillator circuit in accordance with the present invention.

Referring now to FIG. 1, there is shown, schematically, a preferred circuit embodying the present invention. The crystal controlled oscillator circuit includes a silicon transistor 1 having a base 1*b*, an emitter 1*e*, and a collector 1*c*. The transistor shown is an NPN transistor; however, the circuit is not to be limited to such a transistor. By proper modification of other parameters, a PNP transistor may be utilized. Connected to the base 1*b* of transistor 1, is a first electrode of a crystal element 2 which exhibits piezoelectric effects and typically a high "Q." A second electrode of the crystal is connected to one end of the resonant tank circuit comprising the parallel combination of tapped inductor 7 and capacitor 6. In addition to providing means for electrical connection, the electrodes provide the means for supporting therebetween the crystalline unit. Usually, the crystalline unit is cut from a material such as quartz, Rochelle salts, tourmaline or the like. The other end of the parallel combination comprising the resonant tank circuit is connected to the collector 1*c* of the transistor 1 via the RF bypass capacitor 8. The resonant tank circuit is turned to a frequency which is slightly below the series resonant frequency of the crystal element. This series connection of crystal and parallel tank circuit tends to reduce the "Q" of the crystal. Inductor 7 includes an interminate tap 7*a* which is connected to the emitter 1*e* of transistor 1 to provide the oscillation sustaining feedback. Also connected to the second electrode of the crystal element 2 is one side of the D.C. blocking capacitor 5 and one terminal of bias resistor 4 which is connected in parallel with capacitor 5. A silicon diode 3, the barrier capacitance of which is a function of the applied voltage, has the cathode thereof connected to the junction between another terminal of resistor 4 and the other side of blocking capacitor 5. The anode of silicon diode 3 is connected to one end of a parallel resonant circuit comprising tuning capacitor 11 and coil 12, which may be tuned to the oscillator operating frequency or to a harmonic thereof. The other end of this resonant circuit is connected to ground and to the other end of the tank circuit including inductor 7. Coil 12 comprises one winding of transformer T1 and is inductively coupled to winding 13. Winding 13 is connected to stage 14 which may include amplitude limiting circuitry or the like, and which provides the output of the circuit.

Connected between the base **1*b* and the collector 1*c* of the transistor 1 is bias resistor 10. A temperature sensitive resistor 18 is connected between the positive potential terminal of the supply voltage source and the collector 1*c* of the transistor. Resistor 18 is utilized to provide stability for the circuit despite temperature variations. Connected between the collector 1*c* of transistor 1 and the negative or ground potential terminal of the supply voltage source is a resistor network comprising the temperature sensitive resistor 16, which is also used for circuit stabilization, and resistors 15 and 17. Resistors 16 and 17 are connected in parallel with each other and in series with resistor 15. Resistors 15 and 17 are provided to adjust the slope of the resistance-temperature curve of the resistors 15, 16 and 17** network.

Resistor 9 is connected between the base **1*b* of the transistor and the modulation input. Resistor 9 provides isolation for the modulation input. Also connected to the modulation input and to resistor 9 is the resistor 19. This latter resistor is selected such that the D.C. offset at the modulation input is zero. Connected in series with resistor 19 is resistor 20 which is also connected in series with capacitor 21. Capacitor 21 is the RF coupling capacitor which is connected to the output of stage 14. The anode of rectifier diode 23 is connected to the junction between resistor 20 and capacitor 21. The cathode of rectifier diode 23 is connected to ground or other suitable reference potential to which the modulation input, as well as the remainder of the circuit, is referenced. The cathode of regulator diode 22 is connected to the junction between resistors 19 and 20. The anode of regulator diode 22 is connected to the same reference potential source to which the cathode of rectifier diode 23** is connected.

Basically, the circuit operates as a modified Hartley oscillator with the crystal 2 acting as a frequency selective filter between the tank circuit and the amplifier circuit. The amplifier circuit uses a transistor to supply the required power gain for oscillation. The crystal 2 typically vibrates slightly below its series resonant frequency to couple transistor base **1*b* to the tank circuit comprising inductor 7 and capacitor 6. As in many fundamental oscillator circuits, amplified energy in the emitter or output circuit is fed back to the base or control circuit by means of an inductive coupling. A single inductor 7 is used with the portion of the inductor between the tap 7*a* and the reference potential being in the emitter circuit. The amount of signal feedback from the output circuit to the control circuit is controlled by the position of the tap on the inductor which determines the number of turns of the inductor 7 that are in the emitter circuit. The alternating current in the portion of the inductor which is in the emitter circuit induces a signal in the remaining portion of the inductor 7 which is in the base circuit. The amplified signal induced in the base circuit sustains the oscillations in the parallel resonant circuit comprising inductor 7 and capacitor 6, as well as within the crystal element 2**.

Thus, once the amplifier circuit comprising transistor 1 has been turned on by the application of the supply voltage and begins to oscillate, modulation of the oscillation signal may be accomplished by the application of a modulation input signal which is applied to the base of transistor 1 via resistor 9. This modulation signal will cause a variation in the operation of the transistor 1 such that more (or less as the case may be) base-emitter current is supplied via the emitter **1*e*. Since the amount of current which is produced by the emitter of the transistor is applied via the feedback network, more or less energy is stored in the tank circuit comprising capacitor 6 and inductor 7. As is typical in the case of a tank circuit, the potential which is developed thereacross (i.e., the amplitude of the oscillations of the oscillator) is a function of the energy which is stored therein. Since the circuit portion comprising the tank circuit of capacitor 11 and inductor 12, in series with diode 3 and the RC combination of resistor 4 and capacitor 5, is connected across the tank circuit comprising capacitor 6 and inductor 7, the current through the former circuit portion is a function of the potential developed across the latter tank circuit. Diode 3 is defined as a silicon diode having a barrier capacitance which is a function of the voltage applied thereto, typically a Varactor diode. Therefore, as the current through the circuit or the voltage across the diode 3 varies, the capacitance of the diode varies as a function of the signal variation. As the capacitance of diode 3 varies, the total capacitance of the circuit which is in parallel with the tank circuit comprising capacitor 6 and inductor 7** also varies. Hence, the characteristic of the tank circuit varies and, therefore, the frequency to which the circuit is tuned also varies. By proper adjustment of the oscillation amplitude and circuit parameters, the frequency variation can be an exact replica of the modulation signal voltage.

The signal which is generated in winding 12 is inductively coupled to winding 13 and thereby applied to stage 14. This stage (or stages as the case may be) may be designed to clip the signal applied thereto such that undesired amplitude variations of the FM signal are removed. This amplitude limited signal is coupled via RF coupling capacitor 21 to rectifier diode 23 which provides an additional clamp or limitation to the amplitude of the output or FM signal. This opposite polarity signal is applied to the modulation input via resistor 19 such that the D.C. offset at the modulation input is substantially reduced to, ideally, zero. In addition, the regulator diode 22 is so biased by the signal applied thereto via resistor 20 that the voltage change thereacross due to temperature variation is nearly identical to the offset produced by rectification of transistor 1 under ambient temperature variations. This provides further control over the offset variations despite temperature changes.

Thus, it may be seen that the oscillator circuit is a crystal controlled oscillator circuit which operates as a modified Hartley oscillator. The supply voltage is supplied via resistors 18 and 10 so that the proper bias is obtained between the base and collector electrodes. Feedback is provided via the inductor 7 so that sustained oscillation is achieved. The resistor network comprising resistors 15, 16, 17 and 18 are connected to the collector electrode of transistor 1 in order to compensate for any temperature induced frequency variation which may occur. That is, the temperature sensitive resistors 16 and 18 provide the necessary compensation and balance to permit frequency stability of + or −0.01% or better under ambient temperatures typically in the range of −20° C. to +80° C.

To indicate the flexibility of the circuit, it is suggested that diode 3, which has previously been designated as a Varacator type diode, may be replaced by a typical high conductance diode to provide a second type of modulation control. Otherwise, the circuit of FIG. 1 remains the same. In a high conductance diode, the effective resistance of the diode is an inverse function of the current passing through it. Thus, as the voltage applied across high conductance diode 3 varies, the current therethrough varies also. Consequently, the effective resistance of this diode also varies as an inverse function thereof. As a result, the effective reactance of the circuit portion comprising capacitor 5 and series connected diode 3 may be varied. That is, by proper choice of resistor 4 and capacitor 5, the variation of the applied RF voltage will produce variations in the RC network comprising the effective resistance of diode 3, capacitor 5 and parallel resistance 4.

Figure 2:
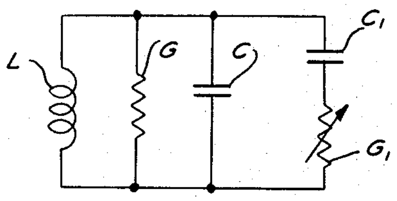
FIG. 2 is a schematic diagram of an equivalent circuit for a portion of the circuit shown in FIG. 1.

Referring now to FIG. 2, the equivalent circuit diagram for a portion of the circuit shown in FIG. 1 is shown. This diagram illustrates the second type of modulation. In this circuit, $G_1$ represents the effective conductance of the high conductance diode 3. $C_1$ represents the effective capacitance of the capacitor 5. L, G and C represent the inductance, conductance and capacitance of the tank circuit comprising capacitor 6 and inductor 7. Since the resistance and, therefore, the conductance of diode 3 varies as a function of the current therethrough, the conductance $G_1$ is shown as variable.

Figure 3:
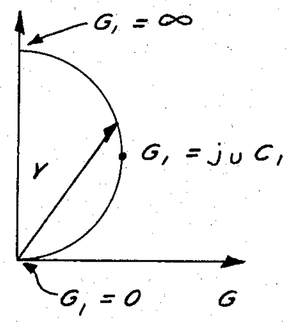
FIG. 3 is a graphic representation of the variation of the admittance of the equivalent circuit shown in FIG. 2.

By referring to FIG. 3, the operation of the equivalent circuit shown in FIG. 2 may be explained. That is, FIG. 3 is a graphic representation of the variation of the admittance Y of the equivalent circuit shown in FIG. 2. As described at page 398 of "Vacuum-Tube Oscillators" by Edson; Wiley, 1953, the circuit shown in FIG. 2 is the simplest circuit for converting a variable conductance G into a variable susceptance B. The graphic representation of FIG. 3 shows that in the conductance modulation embodiment, the variation of the admittance Y of the tank circuit is represented by a semicircular path as the conductance $G_1$ is varied from zero to infinity. In the region of the point $G_1=jwC_1$, an incremental change in $G_1$ results in a positive incremental change in B, but no change in G whereby the resultant admittance variation is purely reactive. The frequency change resulting from this reactance change can also be made a faithful replica of the modulation input signal.

It is noted that the present invention has provided a relatively simple circuit with low distortion. In systems wherein distortion is of importance, such operation is easily attained with the oscillator circuit embodying the present invention. The present invention has provided a relatively simple circuit in which a crystal controlled oscillator may be directly frequency or phase modulated. The modulation is attainable over relatively wide ranges while at the same time the advantages or stability that a crystal controlled oscillator offers are maintained. The circuit embodying the present invention employs a minimum number of parts and is especially adaptable for equipment where size and weight is an important factor.

From the foregoing description, it will be understood that various changes may be made in the form, construction and arrangement of the parts, without departing from the scope of the invention, the form hereinbefore described being merely a preferred embodiment.

I claim:

1. A crystal controlled, frequency modulated oscillator circuit comprising, a transistor having emitter, base and collector electrodes, bias resistors connected to said base and said collector electrodes, means for supplying energy via said bias resistors such that said transistor operates as an amplifier, a tank circuit for storing and discharging energy, a crystal resonator element connected between said base electrode of said transistor and one terminal of said tank circuit, feedback means connected between said emitter electrode of said transistor and a further terminal of said tank circuit, means connected in parallel with said tank circuit to provide variations in the frequency to which said tank circuit is tuned, said last named means including a diode which exhibits different operating characteristics in response to the application of different voltages by said tank circuit, modulating input signal supplying means connected to one electrode of said transistor for varying the amplification of said transistor such that signals applied to said tank circuit via said feedback means vary whereby the voltage supplied to said means connected in parallel with said tank circuit varies.

2. In an oscillator circuit, a transistor having base, emitter and collector electrodes, means for supplying potentials to electrodes of said transistor to provide amplifier operation thereby, a crystal resonator connected to the base electrode of said transistor, a reactive network connected to the emitter electrode of said transistor and to said crystal resonator to provide for variation in the frequency of oscillation of said oscillator circuit, said reactive network including unilaterally conducting means exhibiting different reactances in response to the application of different voltages thereacross, means for applying a modulating signal to the base electrode of said transistor to vary the amplification thereof whereby different voltages which vary in amplitude as a function of the amplitude of said modulating signal are applied to said reactive network, and amplitude limiting means supplied with a signal derived from said oscillator circuit for providing additional control over the frequency operation of said oscillator circuit.

3. The oscillator circuit called for in claim 2 wherein said means for supplying potentials includes at least one potential source and a plurality of resistors, said resistors including at least one pair of temperature sensitive resistors connected to said base and collector electrodes to permit compensation thereby for variations produced by ambient temperature variations.

4. The oscillator circuit called for in claim 2 wherein said crystal resonator incorporates a quartz crystal and vibrates slightly below the inherent series resonant frequency thereof.

5. The oscillator circuit called for in claim 2 wherein said unilaterally conducting means comprises a Varactor diode.

6. A crystal controlled, frequency modulated oscillator circuit comprising, an NPN transistor having emitter, base and collector electrodes, bias resistors connected to said base and collector electrodes, said bias resistors being temperature sensitive and providing suitable compensation in the circuit to permit stable operation under wide ambient temperature ranges, means for supplying energy to said bias resistors such that said transistor operates as an amplifier, a tank circuit for storing and discharging energy, said tank circuit comprising an inductor tuned by a capacitor, a crystal resonator element connected between said base electrode of said transistor and one terminal of said tank circuit, said crystal oscillator exhibiting a series resonant frequency and vibrating slightly therebelow, said tank circuit being tuned slightly below said series resonant frequency of said crystal resonator, feedback means connected between said emitter electrode of said transistor and a terminal on said inductor of said tank circuit, reactive means connected in parallel with said tank circuit to provide variations in the frequency to which said tank circuit is tuned, said last named means including a Varactor diode which exhibits different operating characteristics and barrier capacitance in response to the application thereto of different voltages by said tank circuit, modulating input signal supplying means connected to the base electrode of said transistor for varying the amplification thereof such that signals applied to said tank circuit by said transistor via said feedback means vary whereby the voltage supplied to said reactive means connected in parallel with said tank circuit varies, amplitude limiting means coupled to said reactive means and modulating input signal supplying means, and non-linear impedance means connected to said modulating input means to substantially eliminate D.C. offset thereat.

References Cited

UNITED STATES PATENTS

| | | | |
|---|---|---|---|
| 2,588,551 | 3/1952 | McCoy | 331—181 X |
| 2,823,312 | 2/1958 | Keonjian | 331—176 X |
| 3,061,802 | 10/1962 | Westneat | 332—26 |
| 3,154,753 | 10/1964 | Rusy | 332—26 |
| 3,163,831 | 12/1964 | Fischman et al. | 331—177 X |
| 3,177,454 | 4/1965 | Van Dijkum et al. | 331—177 X |

FOREIGN PATENTS

| | | |
|---|---|---|
| 44,826 | 6/1961 | Poland. |

ALFRED L. BRODY, *Primary Examiner.*

ROY LAKE, *Examiner.*